Oct. 29, 1957 L. D. ARMSTRONG 2,811,474

SEMI-CONDUCTOR DEVICES

Filed April 22, 1953

INVENTOR.
LORNE D. ARMSTRONG

BY J. L. Whittaker

ATTORNEY 2,811,474
Patented Oct. 29, 1957

2,811,474

SEMI-CONDUCTOR DEVICES

Lorne D. Armstrong, Princeton, N. J., assignor to Radio Corporation of America, a corporation of Delaware Application April 22, 1953, Serial No. 350,334

3 Claims. (Cl. 148—33)

This invention relates broadly to semi-conductor devices and more particular to such devices of the type known as transistors that comprise a body of P-type semi-conductive material.

It is well known to make a semi-conductor device such as a transistor by fusing a body of a conductivity type-determining impurity-yielding material to a surface of a body of a semi-conductive material. A common type known as the N–P–N alloy junction transistor comprises a central body of P-type semi-conductive material having two bodies of an N-type impurity-yielding material fused to its surface, thereby comprising two P–N rectifying junctions disposed within the central body adjacent the impurity-yielding bodies.

It has previously been known to make an N–P–N junction transistor by fusing to a P-type semi-conductive body of germanium a body of impurity-yielding material consisting of an allow comprising about 10% antimony and 90% lead. Such an alloy when fused to P-type germanium produces a P–N rectifying junction having desirable electrical properties. However, the physical properties of this alloy are such that junctions formed by fusing it to germanium often exhibit poor stability, especially those junctions larger than about .050″ in diameter. Many such larger junctions have a working life of less than 100 hours and show a 50% loss in efficiency upon standing idle for two months or less. Further, the composition of the lead-antimony alloy is relatively critical to produce satisfactory junctions even of a relatively small size.

It is desirable to produce an N–P–N transistor having a P–N rectifying junction of relatively large area, such as 0.10″ diameter and larger, for many applications, and especially for those requiring a relatively large power output.

Accordingly, it is an object of the present invention to provide an impurity-yielding material that may be alloyed or fused to the surface of a body of P-type semi-conductive material to form an improved P–N rectifying junction.

Another object is to provide an impurity-yielding material for use in making an improved N–P–N junction transistor.

Another object is to provide an improved method of making N–P–N transistors and similar semi-conductor devices including a body of P-type semi-conductive germanium.

Another object is to provide an N–P–N junction transistor having an improved P–N rectifying junction.

Still another object of the invention is to provide an improved N–P–N junction transistor particularly suitable for use in applications requiring relatively large power outputs.

The foregoing objects may be accomplished, and, according to the instant invention, an improved P–N rectifying junction may be formed within a body of P-type semi-conductive germanium, by fusing upon the surface of the body a material consisting essentially of an alloy of lead, bismuth and antimony.

The invention will be more easily understood by reference to the following detailed description and to the drawing of which:

The steps in the production of a device according to the invention are similar to the steps in the production of previous N–P–N transistor devices, except that a different material is employed to form the electrodes and the P–N rectifying junctions. Therefore, it is believed necessary to give here only a brief description of the complete process of forming a device.

Figure 1:
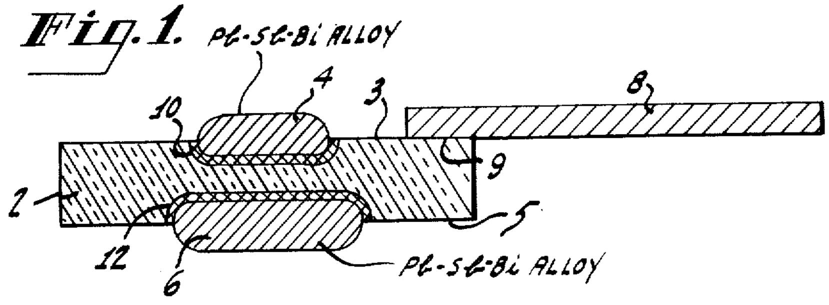
Figure 1 is a schematized, cross-sectional, elevational view of a device according to the invention.

Referring now to Figure 1, according to a preferred embodiment of the invention a wafer 2 of P-type semi-conductive germanium having a resistivity of about 2 to 7 ohm-cms. and about 0.25″ x 0.20″ x .008″ in size is treated to form an N–P–N transistor. A disc 4 about .06″ in diameter and .02″ thick is composed of an alloy according to the present invention consisting of about 45% bismuth, 38% lead and about 17% antimony by weight. The disc is placed upon one side of the germanium wafer. The wafer and disc are placed in a furnace and heated to about 680° C. for about five minutes in a non-oxidizing atmosphere to melt the disc and to cause it to wet and to adhere to the germanium surface. The wafer is then withdrawn from the furnace and turned over. A second disc 6 about 0.10″ x .02″ thick and composed of the same material as the first disc is then placed upon the opposite side 5 of the wafer. An electrical lead 8 providing a base tab having a tinned surface 9 is also placed in contact with a surface 3 of the wafer. The wafer is heated a second time in a non-oxidizing atmosphere at about 68.0° C. for about ten minutes to melt the discs and to cause them to alloy with and to diffuse into the germanium wafer to form two oppositely disposed P–N rectifying junctions 10 and 12, and simultaneously to form a non-rectifying junction between the base tab and the wafer. The device is cooled slowly, preferably at an average rate of about 40° C. per minute. When cool, it may be etched, mounted, and potted according to the usual techniques.

It should be understood that the example described above is merely illustrative insofar as the device produced is concerned, and that the practice of the invention is equally advantageous in the production of other types of transistors, such as a symmetrical transistor, and other semi-conductor devices, such as a germanium diode. The scope of the invention includes all cases where it is desired to form a P–N rectifying junction within a body of P-type semi-conducting germanium by fusing an N-type impurity-yielding material to the body.

It should further be understood that the time and temperature of heating the device to fuse the impurity-yielding material according to the invention is not critical. Although a temperature of about 625° C. to 750° C. and a time of about five to twenty minutes is preferred, satisfactory results may also be obtained by heating at any temperature and for any length of time ordinarily employed in the production of P–N rectifying junctions by the alloy-diffusion process.

P–N rectifying junctions formed according to the invention exhibit electrical characteristics generally similar to those of junctions formed according to previous practice. However, they exhibit a stability many times greater than junctions formed in a similar manner but utilizing the lead-antimony alloy described above. For example, even after 1000 hours of continuous operation under severe testing conditions, junctions formed according to the preferred embodiment of the invention have shown no appreciable deterioration.

A further advantage afforded by the present invention is that in the production of a transistor such as the one described in connection with the preferred embodiment, a thicker and, therefore, stronger germanium wafer may be employed than has heretofore been possible without providing an undesirably large spacing between the two junctions. This is apparently due to the fact that the alloy according to the invention melts at about 125° C., as compared to a melting point of about 250° C. for previously used alloys, and penetrates deeper into the wafer during the fusing process. Since the P–N rectifying junctions are formed closely adjacent the penetration boundary, this characteristic of the alloy according to the present invention permits two opposite P–N rectifying junctions to be disposed at a given distance apart in a thicker wafer than has been heretofore feasible.

Figure 2:
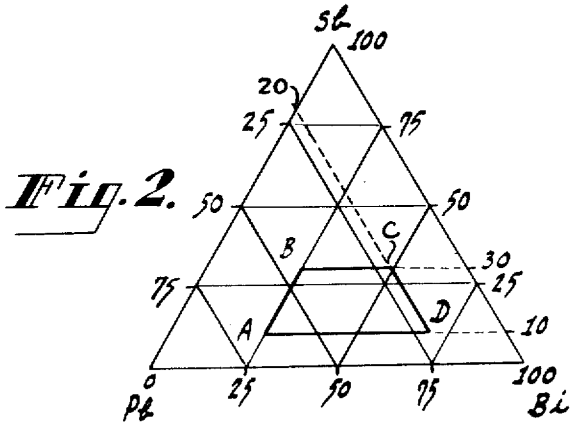
Figure 2 is a diagram representing the ternary system comprising lead, bismuth and antimony, and includes a curve defining the range of compositions within the scope of the present invention.

Figure 2 is a triangular diagram representing all possible alloy compositions in the ternary system comprising lead, bismuth and antimony. The area within the figure ABCD includes all those compositions within the general limits by weight:

| | Percent |
|---|---|
| Lead | 20 to 65 |
| Bismuth | 25 to 70 |
| Antimony | 10 to 30 |

To produce an N–P–N rectifying junction according to the present invention, the composition of the impurity-yielding material is not critical. The figure ABCD defines the approximate limits of the range of compositions included within the scope of the present invention.

A preferred range of compositions comprises by weight:

| | Percent |
|---|---|
| Lead | 40 to 50 |
| Bismuth | 35 to 45 |
| Antimony | 15 to 20 |

Satisfactory results, however, are obtained through the use of any of the compositions represented by points within the figure ABCD.

There have thus been described semi-conductor devices having improved P–N rectifying junctions and methods for making them, which devices comprise a body of P-type semi-conductive material having alloyed and diffused therein a material comprising an alloy of lead, bismuth and antimony. Such junctions are particularly suitable for applications requiring relatively large power outputs.

What is claimed is:

1. A semi-conductor device comprising a body of germanium, an electrode fused thereto and a P–N rectifying junction disposed therein adjacent said electrode, said electrode comprising an alloy having the following proportions by weight:

| | Percent |
|---|---|
| Lead | 20–65 |
| Bismuth | 25–70 |
| Antimony | 10–30 |

2. A semi-conductor device comprising a body of germanium, an electrode fused thereto and a P–N rectifying junction disposed therein adjacent said electrode, said electrode comprising an alloy having the following proportions by weight:

| | Percent |
|---|---|
| Lead | 40–50 |
| Bismuth | 35–45 |
| Antimony | 15–20 |

3. A semi-conductor device including a body of P-type semi-conducting germanium having disposed therein a P–N rectifying junction and an N-type semi-conducting region adjacent to said junction, said region including a relatively small proportion of an alloy consisting essentially of, by weight:

| | Percent |
|---|---|
| Lead | 20–65 |
| Bismuth | 25–70 |
| Antimony | 10–30 |

References Cited in the file of this patent

UNITED STATES PATENTS 2,742,383 Barnes et al. ------------ April 17, 1956

OTHER REFERENCES

Materials and Methods, September 1950, pages 64–65.

UNITED STATES PATENT OFFICE

CERTIFICATE OF CORRECTION

Patent No. 2,811,474

October 29, 1957

Lorne D. Armstrong

It is hereby certified that error appears in the printed specification of the above numbered patent requiring correction and that the said Letters Patent should read as corrected below.

Column 1, line 32, for "an allow" read -- an alloy --; column 2, line 35, for "about 68.0° C." read -- about 680° C. --.

Signed and sealed this 31st day of December 1957.

(SEAL)

Attest:

KARL H. AXLINE

Attesting Officer

ROBERT C. WATSON

Commissioner of Patents